United States Patent
Nakamura et al.

(10) Patent No.: US 10,971,347 B2
(45) Date of Patent: Apr. 6, 2021

(54) CHARGED PARTICLE BEAM APPARATUS

(71) Applicant: Hitachi High-Technologies Corporation, Tokyo (JP)

(72) Inventors: Mitsuhiro Nakamura, Tokyo (JP); Hironori Itabashi, Tokyo (JP); Hirofumi Satou, Tokyo (JP); Tsutomu Saito, Tokyo (JP); Masahiro Sasajima, Tokyo (JP); Natsuki Tsuno, Tokyo (JP); Yohei Nakamura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 268 days.

(21) Appl. No.: 16/306,911

(22) PCT Filed: Jun. 23, 2016

(86) PCT No.: PCT/JP2016/068603
§ 371 (c)(1),
(2) Date: Dec. 4, 2018

(87) PCT Pub. No.: WO2017/221362
PCT Pub. Date: Dec. 28, 2017

(65) Prior Publication Data
US 2021/0020422 A1  Jan. 21, 2021

(51) Int. Cl.
*H01J 49/08* (2006.01)
*H01J 3/26* (2006.01)
(Continued)

(52) U.S. Cl.
CPC ............... *H01J 49/08* (2013.01); *H01J 3/26* (2013.01); *H01J 3/36* (2013.01); *H01J 37/147* (2013.01); *H01J 49/10* (2013.01); *H01J 2237/15* (2013.01)

(58) Field of Classification Search
CPC .... H01J 49/08; H01J 49/10; H01J 3/26; H01J 3/36; H01J 37/147
(Continued)

(56) References Cited

U.S. PATENT DOCUMENTS

| | | | |
|---|---|---|---|
| 2004/0099805 A1 | 5/2004 | Ochiai et al. | |
| 2005/0214958 A1* | 9/2005 | Nakasuji | H01J 37/28 438/14 |

(Continued)

FOREIGN PATENT DOCUMENTS

| | | |
|---|---|---|
| JP | 2004-151045 A | 5/2004 |
| JP | 2005-019258 A | 1/2005 |

(Continued)

OTHER PUBLICATIONS

International Search Report of PCT/JP2016/068603 dated Sep. 6, 2016.

*Primary Examiner* — Nicole M Ippolito
(74) *Attorney, Agent, or Firm* — Mattingly & Malur, PC (57) ABSTRACT

In order to provide a charged particle beam apparatus capable of stably detecting secondary particles and electromagnetic waves even for a non-conductive sample under high vacuum environment and enabling excellent observation and analysis, the charged particle beam apparatus includes a charged particle gun (12), scanning deflectors (17 and 18) configured to scan a charged particle beam (20) emitted from the charged particle gun (12) onto a sample (21), detectors (40 and 41) configured to detect a scanning control voltage input from an outside into the scanning deflectors, an arithmetic unit (42) configured to calculate, based on the detected scanning control voltage, irradiation pixel coordinates for the charged particle beam; and an
(Continued)

irradiation controller (45) configured to control irradiation of the sample with the charged particle beam according to the irradiation pixel coordinates.

7 Claims, 8 Drawing Sheets

(51) Int. Cl.
  *H01J 3/36* (2006.01)
  *H01J 37/147* (2006.01)
  *H01J 49/10* (2006.01)
(58) Field of Classification Search
  USPC .... 250/396 R, 397, 306, 307, 309, 310, 311, 250/492.1, 492.3
  See application file for complete search history.

(56) References Cited

U.S. PATENT DOCUMENTS

| | | | |
|---|---|---|---|
| 2010/0163727 A1* | 7/2010 | Bell | H01J 37/268 250/307 |
| 2011/0279143 A1* | 11/2011 | Toba | G01B 15/00 324/762.05 |
| 2013/0161511 A1 | 6/2013 | Karimata et al. | |
| 2013/0241562 A1* | 9/2013 | Jin | G09G 3/3233 324/414 |
| 2015/0270094 A1 | 9/2015 | Ikku | |

FOREIGN PATENT DOCUMENTS

| | | |
|---|---|---|
| JP | 2013-097869 A | 5/2013 |
| JP | 2015-184040 A | 10/2015 |

* cited by examiner

CHARGED PARTICLE BEAM APPARATUS

TECHNICAL FIELD

The present invention relates to a charged particle beam apparatus.

BACKGROUND ART

A scanning electron microscope (SEM), which is one of charged particle beam apparatuses, converges electrons emitted from an electron source by using an electron lens to a thin electron beam and scans the thin electron beam over a sample by using a magnetic field or an electric field generated by a scanning deflector. Charged particles (secondary electrons or reflected electrons) generated from a sample by irradiation with an electron beam are detected by an electron detector and converted into image data in synchronization with scanning of the electron beam, and thus a scanned image is obtained.

By irradiation with an electron beam, electromagnetic waves (X-rays or light) are emitted from the sample as well as the above-stated charged particles. Particularly, performing analysis of the composition of a sample by mounting an energy dispersive X-ray spectrometry (EDX) apparatus on an SEM and detecting characteristic X-rays is being established as one of applications of the SEM (for example, PTL 1) as well as an observation of a sample shape.

CITATION LIST

Patent Literature

PTL 1: JP-A-2015-184040

SUMMARY OF INVENTION

Technical Problem

In recent years, not only conductive samples, but also non-conductive samples, such as functional ceramics, are increasingly subject to SEM observations and EDX analyses. In particular, in order to accurately observe or analyze an original state of a surface, a sample surface is often not subjected to a process for deposition of a conductive material. In such cases, a method of setting the surrounding environment of the sample to a low vacuum environment from several tens of Pa to several hundreds of Pa is used.

When the surrounding environment of the sample is set to a low vacuum environment, gas molecules are ionized by the interaction between an electron beam and the gas molecules. When a sample is non-conductive, the gas molecules ionized to positive charges are combined with electrons on a surface of the sample, which becomes a cause of electrification, and suppress the electrification of the sample. However, when an electron beam passes through a low vacuum environment, electrons are scattered due to collisions with residual gas. As a result, the irradiation diameter of the electron beam increases, thereby causing problems like reduction of the spatial resolution of an image to be observed and formation of white noises. Also, in an EDX analysis, there is a problem that X-ray excitation occurs in a region other than a target region of the analysis due to scattered electrons, and thus the accuracy of analysis is deteriorated.

Known methods of suppressing electrification of a non-conductive sample that has not been subjected to a process for deposition of a conductive material and while maintaining a high vacuum environment include a method of reducing the number of electrons irradiated to a sample per unit time period by increasing the speed of scanning an electron beam, a method of suppressing electrification of a surface of a sample for observation by changing the interval between scan lines according to electrification time constants of the sample to be observed, a method of reducing electrification of a surface of a sample due to irradiation of an electron beam by setting the scanning speed of the electron beam to move between pixels at a high speed by skipping a plurality of pixels, and a method of controlling the number of irradiated electrons by pulsing an electron beam and imaging an obtained signal.

However, in an SEM having mounted thereon a device for externally controlling electron beam scanning, such as an EDX apparatus, when scanning of an electron beam is externally controlled by an external device like the EDX apparatus, the SEM cannot determine the position of the electron beam on a sample, and thus it is not possible to suppress the electrification of a non-conductive sample in a high vacuum environment by using the above method.

The present invention provides a charged particle beam apparatus which can stably detect charged particles and electromagnetic waves and observe or analyze a sample even for a non-conductive sample under a high vacuum environment.

Solution to Problem

An aspect of the present invention is to provide a charged particle beam apparatus including:
a charged particle gun;
a scanning deflector for scanning a charged particle beam emitted from the charged particle gun onto a sample;
a detector configured to detect a scanning control voltage input from an outside into the scanning deflector;
an arithmetic unit configured to calculate, based on the detected scanning control voltage, irradiation pixel coordinates for the charged particle beam; and
an irradiation controller configured to control irradiation of the sample with the charged particle beam according to the irradiation pixel coordinates.

Advantageous Effect of the Invention

According to the present invention, a charged particle beam apparatus capable of stably detecting charged particles and electromagnetic waves and enabling observation or analysis of a sample even for a non-conductive sample under a high vacuum environment can be provided.

DESCRIPTION OF EMBODIMENTS

To resolve the above-stated problems, the inventors of the present invention have examined an SEM having mounted thereon an EDX apparatus reconstructed with reference to the technical configuration disclosed in PTL 1 or an SEM on which the EDX apparatus can be mounted.

Figure 9:
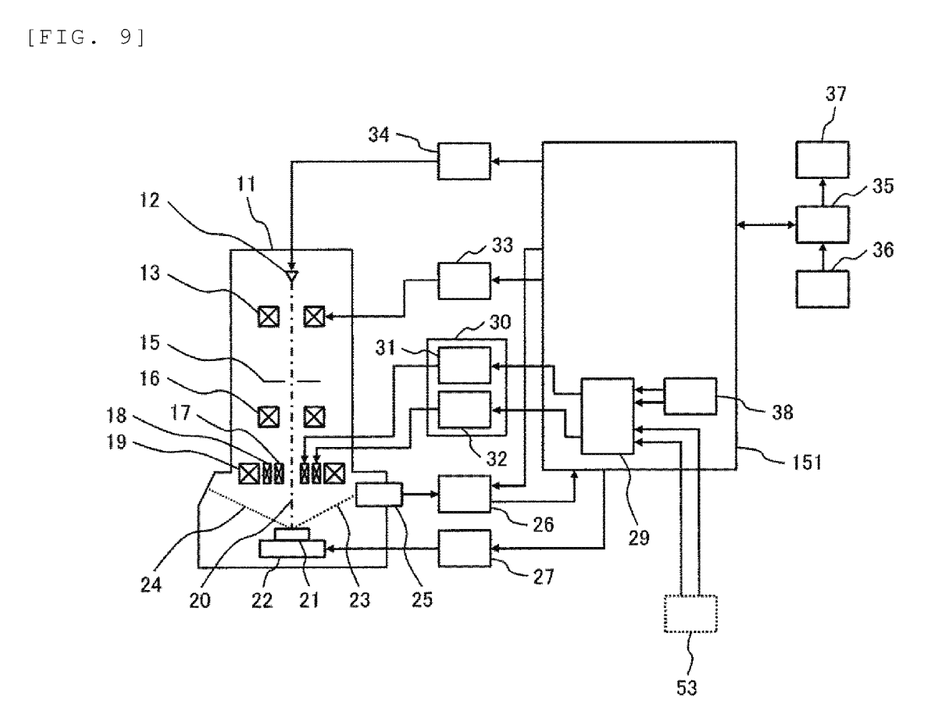
FIG. 9 is a schematic perspective view (partial cross-sectional view) of an example of an SEM on which an EDX apparatus reconstructed by the inventors with reference to the prior art can be mounted.

FIG. 9 is a schematic perspective view (partial cross-sectional view) of an SEM on which a reconfigured EDX apparatus can be mounted. An electron gun 12 is provided in a housing 11, and an electron beam 20 is emitted from the electron gun 12. The electron beam 20, which is processed by a first condenser lens 13 and passes through an aperture 15, passes through a second condenser lens 16, is deflected by an X scanning deflector 17 and an Y scanning deflector 18, and is processed by an objective lens 19, so as to be irradiated to focus on a surface of a sample 21 placed on a sample stage 22. In order to control an irradiation point of the electron beam 20 on the sample 21, driving currents for the X scanning deflector 17 and the Y scanning deflector 18 are generated through a scan driver 30 based on a scanning control voltage output from an SEM main controller 151. From the irradiation point of the electron beam 20 on the sample 21, secondary electrons 23 and characteristic X-rays 24 are generated.

Here, the energy of the secondary electrons is generally defined to be 50 eV or less, and secondary electrons excited at locations where distances to the surface of the sample are relatively long lose their energy and absorbed inside a sample before they reach the surface of the sample. Therefore, an secondary electron image also has a characteristic that it has a contrast mainly reflecting a surface shape of a sample. In addition, secondary electrons are susceptible to the influence of potential in the vicinity of a surface of a sample since the energy thereof is small. Abnormal contrasts due to electrification may be often observed in secondary electron images obtained with respect to non-conductive samples. Also, for semiconductor samples, secondary electron images are often observed in order to obtain voltage contrast reflecting the internal structure.

The secondary electrons 23 are detected by a secondary electron detector 25 and are analog-to-digital (AD) converted by a detection signal processor 26. An AD-converted detection signal is integrated as secondary electron data derived from a certain pixel based on an integration timing signal input to the detection signal processor 26 from the SEM main controller 151 and is converted into image data. The image data is transferred from the detection signal processor 26 to a computer 35 via the SEM main controller 151 every time acquisition of 1 line image data or of 1 frame image data is completed according to scan speeds and is displayed on a monitor 37 as an SEM image.

The electron gun 12 is controlled by an electron gun controller 34, the first condenser lens 13, the second condenser lens 16, and the objective lens 19 are controlled by an electron optical system controller 33, and the sample stage 22 is controlled by a sample stage controller 27, wherein operations thereof are performed as the SEM main controller 151 transmits set values input to the computer 35 by using an operation interface 36 to the electron gun controller 34, the electron optical system controller 33, and the sample stage controller 27.

Figure 3:
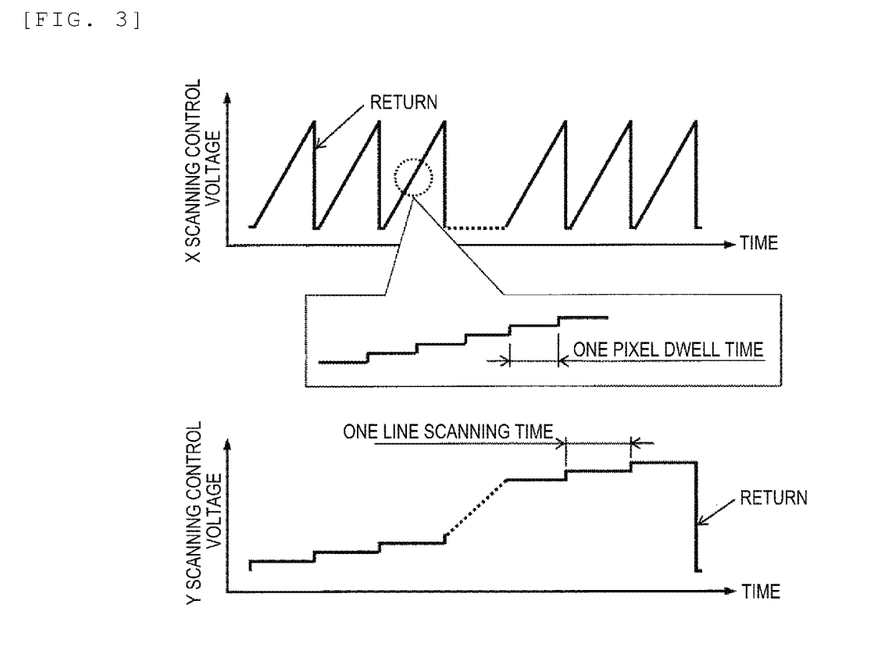
FIG. 3 is a diagram for describing an X scanning control voltage and an Y scanning control voltage.

The SEM main controller 151 includes a scanning control voltage switching unit 29 which switches a scanning control voltage to be input to the scan driver 30 between a scanning control voltage input from an SEM scanning control voltage generator 38 and a scanning control voltage input from an EDX scanning control voltage generator 53 provided at an EDX apparatus. An X scan driver 31 and an Y scan driver 32 provided in the scan driver 30 are driven respectively based on an X scanning control voltage and a Y scanning control voltage as shown in FIG. 3, and thus currents following in the X scanning deflector 17 and the Y scanning deflector 18 are controlled to perform a 2-dimensional scanning of the electron beam 20. In this present reconstructed example, the X scanning deflector and the Y scanning deflector 18 are described as electromagnetic deflectors, but they may be electrostatic deflectors.

Figure 10:
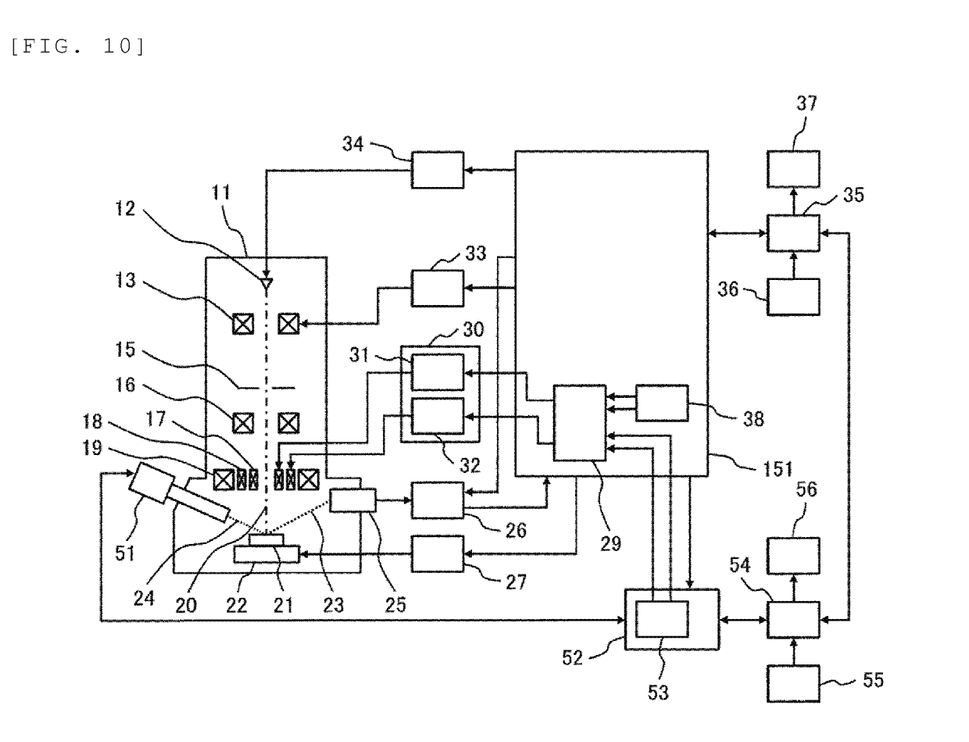
FIG. 10 is a schematic perspective view (partial cross-sectional view) of an example of an SEM on which an EDX apparatus reconstructed by the inventors with reference to the prior art is mounted.

FIG. 10 shows a schematic perspective view (partial cross-sectional view) of an SEM having mounted thereon the reconstructed EDX apparatus. Reference numerals same as those shown in FIG. 9 denote the same components. An example of the mounted EDX apparatus may be an EDX apparatus disclosed in PTL 1. An EDX detector 51 is attached to the housing 11 of the SEM and detects the characteristic X-ray 24 generated from the sample 21. A detected signal is converted into an energy spectrum based on the peak value thereof in the EDX main controller 52. Energy spectrum data is transmitted to a computer 54 and is displayed on a monitor 56 as an energy spectrum image or an element mapping image. The EDX main controller 52 includes the EDX scanning control voltage generator 53, and a scanning control voltage generated by the EDX scanning control voltage generator 53 is input to the SEM main controller 151.

Furthermore, the computer 35 and the computer 54 are connected through a communication cable and, when starting an EDX analysis, an EDX analysis start command is transmitted from the computer 54 to the computer 35. After receiving the command, the computer 35 transfers corresponding information to the SEM main controller 151 and operates the scanning control voltage switching unit 29 to switch the input source of a scanning control voltage input to the scan driver 30 from the SEM scanning control voltage generator 38 to the EDX scanning control voltage generator 53. That is, during an EDX analysis, the EDX apparatus controls scanning of the electron beam 20. At this time, it is controlled at the SEM so as to fix factors including an acceleration voltage or an electron dose of the electron beam, but scanning of the electron beam is not performed by the SEM. Therefore, the position of the electron beam on a sample cannot be determined.

Generally, a charged particle detector or an electromagnetic wave detector has a response time characteristic that an output signal is maintained for a certain period of time even after charged particles or electromagnetic waves generated from a sample are no longer incident. The time until an output signal derived from incidence of charged particles or electromagnetic waves to a corresponding detector disappears after the charged particles or the electromagnetic waves are no longer incident will be referred to as an output duration below. For example, in a silicon drift detector (SDD) used for X-ray detection in an EDX, charges generated by an X-ray incident to the SDD are collected to a collection electrode according to an electric field applied into the SDD. A drift time thereof depends on an area of detection, and thus the output duration of the SDD becomes on the order of microseconds.

The minimum unit constituting a target region for observation or analysis will be referred to as a pixel below regardless of differences between the observation and the analysis. When signals between two pixels or a plurality of pixels that are successively detected by using a detector having an output duration as described above overlap, pixels from which the detected signals are emitted cannot be determined, and thus the spatial resolution of a result of an observation and an analysis is deteriorated.

In order to prevent this, detected data is generally discarded through a time period longer than the output duration before and after an electron beam moves between pixels.

However, when a method of changing the interval between scan lines according to a charging time constant of a sample to be observed and thus suppressing the electrification of surface of the sample or a method of suppressing the electrification of surface of the sample by irradiation of an electron beam by setting the electron beam to move between pixels at a high speed by skipping a plurality of pixels is applied in order to suppress the electrification of the sample, the following limitation arises.

That is, when the time during which the electron beam continuously irradiated onto the sample stays at a certain pixel is shorter than the output duration of the detector, if a process for discarding detected data is executed to prevent signal overlaps between pixels, no detection data will remain. Therefore, there is a minimum time during which the electron beam stays at a certain pixel, and it is difficult to obtain the effect of suppressing electrification unless the minimum time is short enough to effectively suppress the electrification of the sample.

The electron beam is blanked in an imaging method that the number of irradiated electrons is controlled by pulsing the electron beam and intermittently irradiated onto a sample, and thus the time for irradiating the electron beam to a certain pixel and a time for blocking the electron beam according to the output duration of a detector can be independently set. However, if the EDX apparatus does not have the function of outputting a blanking control signal, it is necessary to add the function to the EDX apparatus. Also, even if the EDX apparatus is capable of outputting a blanking control signal, a means for blanking or a response time characteristic of the blanking depends on the device configuration of the SEM. Therefore, it is uncertain whether desired intermittent irradiation control is possible with respect to an electron beam, and thus it becomes difficult to maintain compatibility of versatility and electrification suppression function of the EDX apparatus.

Therefore, as a result of examining methods for solving the above-mentioned problems, the inventors have found out that irradiation of a charged particle beam can be controlled based on coordinates of pixels on a sample to which the charged particle beam is irradiated, the coordinates calculated based on a value obtained by detecting a scanning control voltage input from the outside. Therefore, the SEM can determine the position of an electron beam on a sample even when scanning of the electron beam is controlled by an external device, such as the EDX apparatus, and, in a high vacuum environment, for example, electrification of a non-conductive sample can be suppressed by using the above-stated method.

Hereinafter, embodiments of the present invention will be described with reference to the drawings. In the present embodiment, an SEM using electrons as primary charged particles will be described, but the present invention is also applicable to a scanning transmission electron microscope (STEM). The present invention is also applicable to devices using ions as primary charged particles (for example, a scanning ion microscope (SIM), etc.). In that case, the optical system is replaced by an electrostatic lens and an electrostatic deflector, but it does not affect the application of the present invention. In the present embodiment, an EDX apparatus is given as an apparatus for controlling scanning of an SEM by externally inputting a scanning control voltage to the SEM, but the present invention is also applicable to cases where an apparatus like an electron backscatter diffraction (EBSD) apparatus or a superconducting transition edge sensor (TES) type X-ray microcalorimeter apparatus is mounted on the SEM.

First Embodiment

An SEM on which an EDX apparatus can be mounted or is mounted according to the first embodiment of the present invention will be described with reference to FIGS. 1 to 5. Regarding the reference numerals shown in FIGS. 1 and 2, the same reference numerals denote the same components in FIGS. 9 and 10 described above as the prior art.

Figure 1:
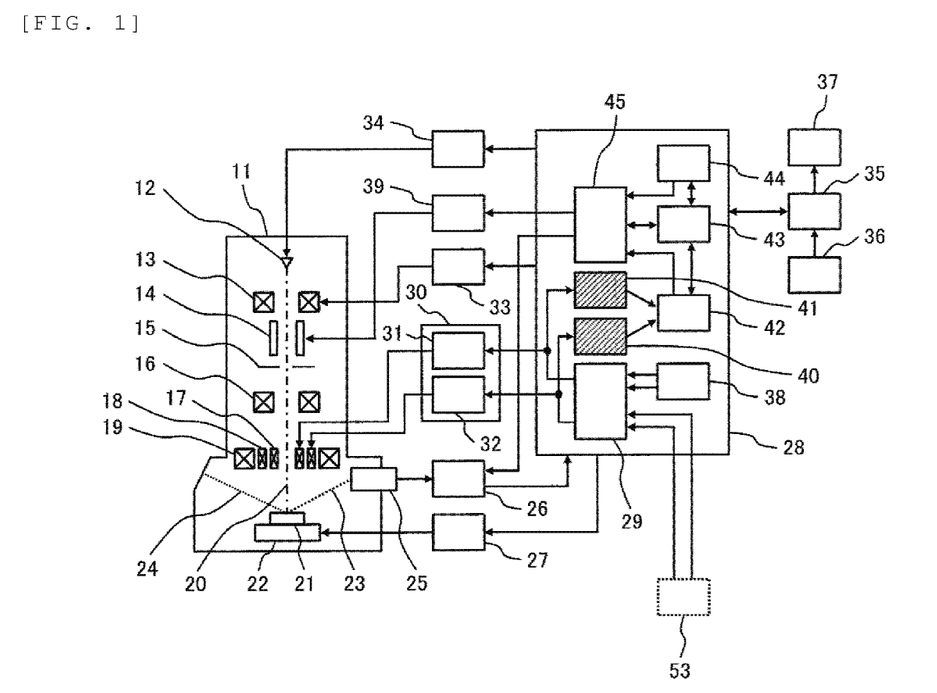
FIG. 1 is a schematic perspective view (partial cross-sectional view) of an example of an SEM on which an EDX apparatus can be mounted according to a first embodiment.

FIG. 1 is a schematic perspective view (partial cross-sectional view) of an SEM on which an EDX apparatus can be mounted, according to the present embodiment. Compared to the SEM main controller 151 of FIGS. 9 and 10, an SEM main controller 28 according to the present embodiment has the following additional functions. That is, in the SEM main controller 28, outputs of the scanning control voltage switching unit 29 for X scanning and Y scanning are branched, respectively AD-converted by an X scanning detection AD converter 41 and a Y scanning detection AD converter 40, and input to an arithmetic unit 42 may be obtained.

As shown in FIG. 3, the value of the scanning control voltage does not change for a certain period of time corresponding to one pixel dwell time or one line scan time and changes into a rectangular shape at a timing of shifting to a next pixel or a next line. Therefore, in the arithmetic unit 42, by determining whether a difference between previous and current input values exceeds a preset threshold value (for example, 10 mV in the case of transition between adjacent pixels and several V in the case of returning associated with completion of one scanning cycle), pixel shifting timings for X scanning and Y scanning can be detected.

In addition, by counting the number of detections of the pixel shifting timings and detecting the returning of the scanning control voltage, a pixel coordinates that is the target of deflection of the current scanning control voltage can be calculated. In order to remove the high frequency noise components overlapping an input voltage of an AD converter, a weighted average of digital data corresponding to a plurality of number of times immediately before calculation of a difference in the arithmetic unit 42 may be obtained.

When a pixel shift timing is detected based on the above-stated calculation, the arithmetic unit 42 inputs a pixel shift timing signal to a blanking controller 45 included in the SEM main controller 28 and, at the same time, records data regarding pixel coordinates that is the target of deflection of the current scanning control voltage in the storage unit 43.

The blanking controller 45 can access the storage unit 43 having stored therein a pre-set blanking period, a Duty ratio that expresses the percentage of electron beam irradiation ON during the blanking period, the number of pixels to skip, which is the number of pixels, not irradiated with electron beam that are sandwiched between a pixel having irradiated thereon an electron beam and the next pixel to be irradiated with the electron beam, and the current pixel coordinate data updated by the arithmetic unit 42 and, according to a corresponding pixel shifting timing signal and the stored information referred to from the storage unit 43, inputs a blanking control signal to a blanking driver 39 in order to control ON/OFF of the irradiation of the electron beam 20 onto the sample 21. The blanking driver 39 generates a voltage for a blanker 14 based on the blanking control signal. When a voltage is applied to the blanker 14, the electron beam 20 is deflected to the outside of the aperture 15, and thus the irradiation to the sample 21 is turned off.

The blanking controller 45 may also include a unit for inputting a pixel shift timing signal from the arithmetic unit 42 and a pixel shift timing signal generator 44 included in the SEM main controller 28, and thus an input source can be selected according to set conditions input to the computer 35. Alternatively, blanking control can be turned off by blocking inputs from both input sources. Furthermore, the blanking controller 45, in the same manner as described above, determines whether irradiation of the electron beam 20 onto the sample 21 is turned on and off according to the pixel shift timing signal input from the arithmetic unit 42 or the pixel shift timing signal generator 44 and the stored information referred to from the storage unit 43 and inputs an integration timing signal for controlling whether to take in or discard a detection signal of the secondary electron detector 25 to the detection signal processor 26.

Figure 4:
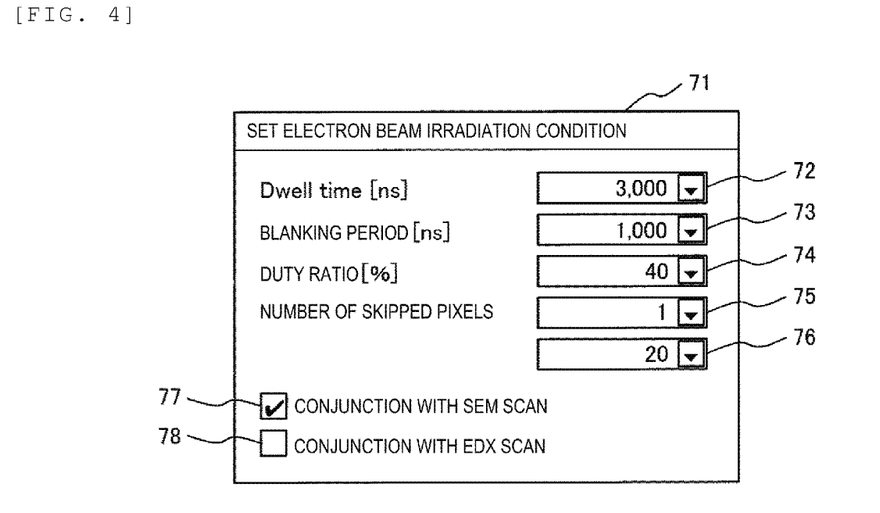
FIG. 4 is a diagram showing an example of a GUI for setting conditions of an electron beam irradiation in the SEM according to the first embodiment.

FIG. 4 shows an electron beam irradiation condition setting screen 71 of the SEM according to the present embodiment. The electron beam irradiation condition setting screen 71 includes, as setting items, a dwell time 72 corresponding to one pixel dwell time, an electron beam blanking period 73, the above-stated Duty ratio 74, the above-stated number of pixels to skip 75, and an number of frame integrations 76 expressing the number of frames used in an integration process for forming one secondary electron image by using image data obtained through one Y scanning as one frame, an SEM scanning conjunction checkbox 77 for setting whether to perform the blanking operation in conjunction with an SEM scanning control voltage, and an EDX scanning conjunction checkbox 78 for setting whether to perform the blanking operation in conjunction with an EDX scanning control voltage in the similar manner.

Depending on a set time of the dwell time 72 selected from a pull-down list or text-input, options corresponding to 1/n of the set time (n=1, 2, 3, . . . ) is displayed in the pull-down list of the blanking period 73. Furthermore, according to the number s of pixels to skip (s=0, 1, 2, 3, . . . ) selected from the pull-down list, options corresponding to (s+1)·p is displayed in the pull-down list of the number of frame integrations 76, such that the number of times p of integration of pixels (p=1, 2, 3) is uniform throughout a scanned region. The SEM scanning conjunction checkbox 77 and the EDX scanning conjunction checkbox 78 are in an exclusive relationship with each other and cannot be checked and turned ON at the same time, but they can be turned OFF at the same time without being checked. In that case, the blanking operation set on the electron beam irradiation condition setting screen 71 is not executed even when scanning of an electron beam is started based on a scanning control voltage of either the SEM or the EDX apparatus.

Figure 2:
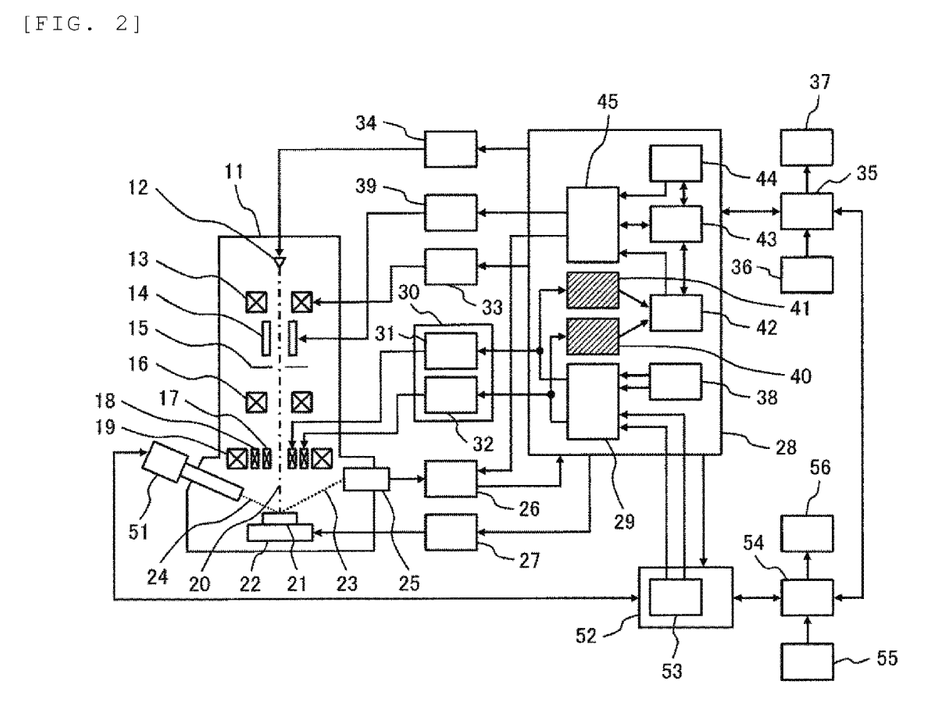
FIG. 2 is a schematic perspective view (partial cross-sectional view) of an example of an SEM having mounted thereon an EDX apparatus according to the first embodiment.

FIG. 2 is a schematic perspective view (partial cross-sectional view) of an SEM on which an EDX apparatus is mounted, according to the present embodiment. A procedure for performing an element mapping analysis using an EDX apparatus according to the present embodiment will be described.

A required acceleration voltage of the electron beam 20 is defined by a critical excitation voltage of the characteristic X-ray of an element to be analyzed. In order to obtain sufficient characteristic X-ray intensity, it is preferable to apply the acceleration voltage that is twice the critical excitation voltage or higher. When a contained element is unknown, the acceleration voltage is generally set to be from 15 kV to 20 kV. In the case where the quantitativeness of analysis for light elements is important or when a diffusion region in a sample 21 of the electron beam 20 is reduced to increase the spatial resolution of the analysis, a lower acceleration voltage is set according to these conditions. The magnification of an electron beam scanning area is set to a magnification assumed at the time of an elemental mapping analysis, and the sample stage 22 is manipulated to move to an observation field of view nearby a target area to be analyzed.

The adjustment of the irradiation current amount of the electron beam 20 is performed after the EDX scanning conjunction checkbox 78 is turned OFF in advance on the electron beam irradiation condition setting screen 71 shown in FIG. 4, and the first condenser lens 13 and the second condenser lens 16 of the SEM are configured, such that a dead-time displayed in a GUI of the EDX apparatus is within a predetermined range (for example, from 20% to 30%).

After setting the acceleration voltage and an irradiation current amount, the dwell time 72 is selected from the pull-down list or text-input according to a value assumed at the time of an element mapping analysis on the electron beam irradiation condition setting screen 71.

Next, the blanking period 73 and the Duty ratio 74 are respectively set in the pull-down list. After turning the SEM scanning conjunction checkbox 77 ON, scanning of the electron beam 20 is started at the SEM to obtain a secondary electron image. When an abnormal contrast due to electrification of the sample 21 is visually recognized in the secondary electron image, the blanking period 73 and the Duty ratio 74 set as described above are changed. Furthermore, in addition to those described above, the number of pixels to be skipped 75 and the number of frame integrations 76 are set, and it is checked whether the abnormal contrast can be seen in a re-obtained secondary electron image.

In a case where the influence of an immediately previous electron beam irradiation remains, changing of the blanking period 73, the Duty ratio 74, the number of pixels to be skipped 75, and the number of frame integrations 76 and acquisition of a secondary electron image are repeated, thereby discovering an electron beam irradiation condition without the abnormal contrast appearing in the secondary electron image. In particular, when it is necessary to lower the Duty ratio 74, it is expected that a count rate of the characteristic X-rays will be lowered. Therefore, it is preferable to check whether a secondary electron image without the abnormal contrast can be obtained even if the number of frame integrations is further increased.

After a desired electron beam irradiation condition is obtained as described above, a set value identical to the number of frame integrations 76 in the electron beam irradiation condition is set to the GUI of the EDX apparatus. The observation field of view is moved to the target region to be analyzed, the EDX scanning conjunction checkbox 78 is turned ON with respect to the electron beam irradiation condition setting screen 71, and an element mapping analysis is started at the EDX apparatus.

At the time of starting the analysis, an EDX analysis start command is transmitted from the computer 54 to the computer 35 as described above and the scanning control voltage switching unit 29 switches the input source of a scanning control voltage to be selected to the EDX apparatus, and thus the SEM can detect the start of analysis.

Figure 5:
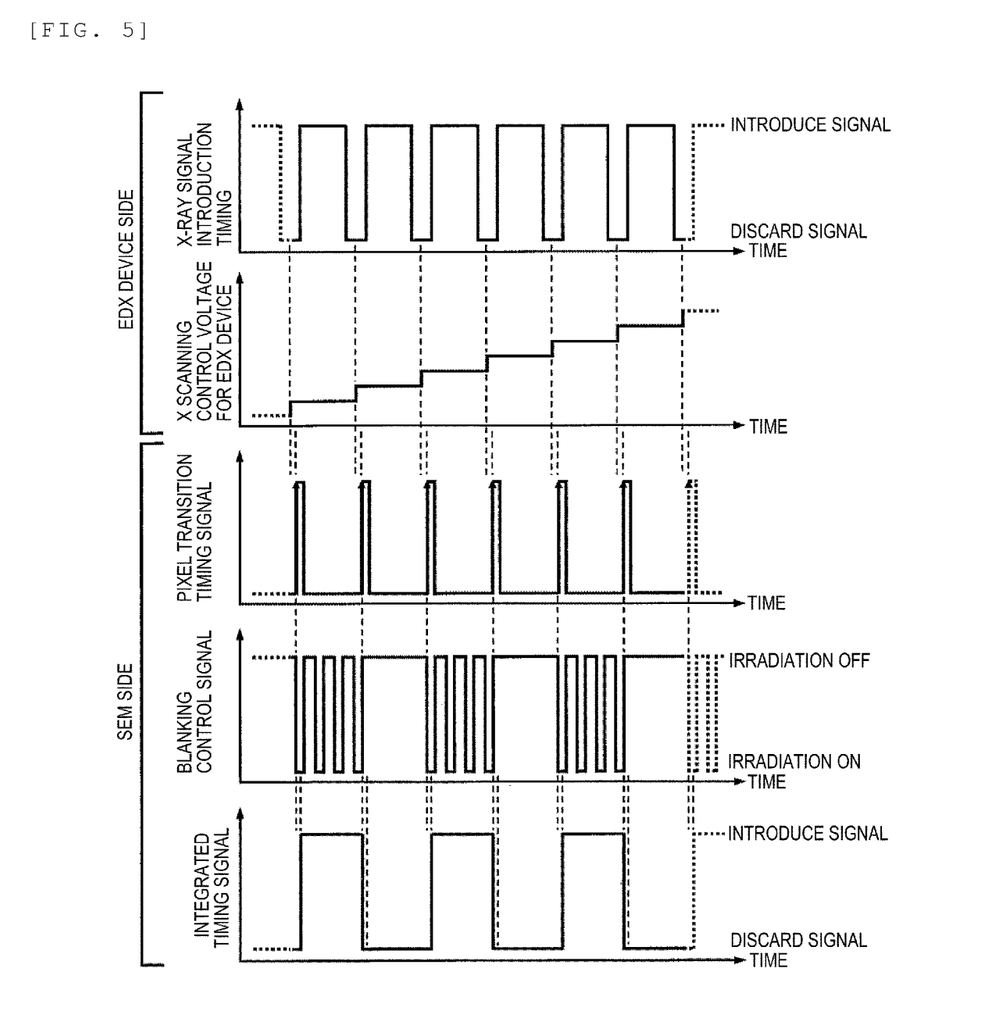
FIG. 5 is a diagram for describing a blanking behavior during an EDX analysis in the SEM shown in FIG. 2.

FIG. 5 is a diagram for describing a blanking operation during an EDX analysis in the SEM shown in FIG. 2. A timing for acquiring an X-ray signal is controlled by the EDX apparatus with reference to the time waveform of a scanning control voltage input from the EDX apparatus to the SEM. In the SEM, while driving the X scanning deflector 17 and the Y scanning deflector 18 based on the scanning control voltage input from the EDX apparatus as described above, the X scanning detection AD converter 41, the Y scanning detection AD converter 40, and the arithmetic unit 42 detect a pixel shift timing and calculate pixel coordinates serving as the target of deflection.

After accessing the storage unit 43 and updating pixel coordinate data, the arithmetic unit 42 inputs a pixel shifting timing signal to the blanking controller 45. Compared to a pixel shift timing regarding a scanning control voltage for the EDX apparatus, a delay corresponding to a sum of a time difference between system clocks, a conversion period of an AD converter or a weighted average process regarding digital data, a difference calculation or a comparison with a threshold value, and a process time required for accessing the storage unit 43 occurs in a pixel shift timing detected by the SEM. However, the delay is about 100 ns and is relatively short as compared to a dwell time (generally, several µs or longer) at the time of the EDX analysis, thus being negligible. Strictly speaking, there is also a delay time from the input of the pixel shift timing signal until completion of a voltage application to the blanker 14. However, the delay time is about dozens of ns and is relatively short, thus being negligible.

The blanking controller 45 inputs a blanking control signal to the blanking driver 39 based on content stored in the storage unit 43 and the pixel shift timing signal and, at the same time, inputs an integration timing signal to the detection signal processor 26. Secondary electron data acquired by the detection signal processor 26 through the secondary electron detector 25 based on the integrated timing signal is subjected to frame integration, thus being converted to a secondary electron image reflecting electrification state of the sample 21 during an element mapping analysis. Also, by displaying the secondary electron image on the monitor 37 of the SEM, electrification states of the sample during and after the analysis can be checked. The secondary electron data acquired through the secondary electron detector 25 by the detection signal processor 26 based on the integration timing signal is input as a video signal from the SEM main controller 28 to the EDX main controller 52. As described above with reference to FIG. 5, the secondary electron data is acquired substantially in synchronization with the pixel shift timing of the scanning control voltage input from the EDX apparatus to the SEM. Therefore, the secondary electron data can be associated with pixels even in the EDX apparatus. Therefore, if the EDX apparatus is provided with function for integrating frames of the above-stated video signal, a secondary electron image can be displayed on a monitor 56 of the EDX apparatus.

As described above, according to the present embodiment, similarly to the prior art, during an EDX analysis, while the configuration that the EDX apparatus performs a scanning control is maintained, by detecting a pixel shift timing and calculating pixel coordinates serving as a current target of deflection, pre-set electron beam irradiation conditions for respective pixels are applied to the EDX analysis. Therefore, electrification of a sample even for a not-conductive sample being analyzed under a high vacuum environment can be suppressed.

Second Embodiment

A second embodiment will be described with reference to FIGS. 6 to 8. Incidentally, descriptions given above in the first embodiment and not given below in the present embodiment can also be applied to the present embodiment unless there is an extraordinary circumstance.

Figure 6:
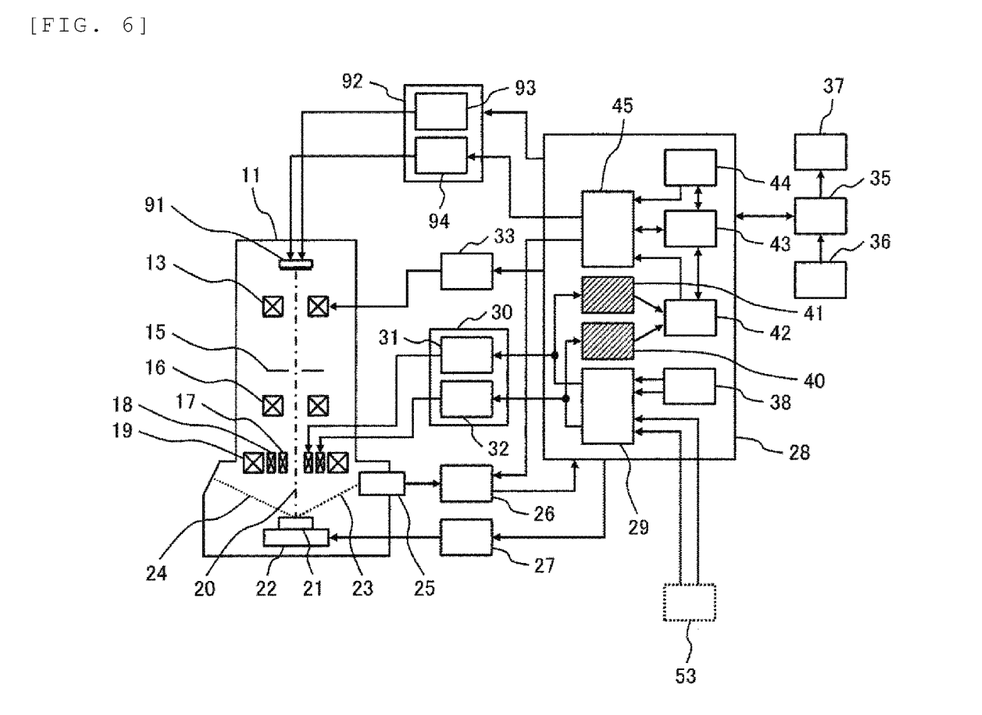
FIG. 6 is a schematic perspective view (partial cross-sectional view) of an example of an SEM on which an EDX apparatus can be mounted, according to a second embodiment.

FIG. 6 is a schematic perspective view (partial cross-sectional view) of an example of an SEM on which an EDX apparatus can be mounted, according to the present embodiment. In the SEM of the present embodiment, the electron gun 12 of the SEM shown in FIG. 1 is replaced by an optically-excited electron gun 91, the electron gun controller 34 is replaced by an optically-excited electron gun controller 92, and the blanker 14 and the blanking driver 39 are removed.

The optically-excited electron gun controller 92 includes a high voltage generator 93 and an excitation light controller 94. An acceleration voltage and an extraction voltage generated by the high voltage generator 93 are introduced into an electrode in the optically-excited electron gun 91, wherein the electrode is described below. The excitation light controller 94 generates a laser beam having a wavelength from about 600 nm to about 800 nm, and the laser beam is introduced into the optically-excited electron gun 91 through an optical transmission means like an optical fiber.

Figure 7:
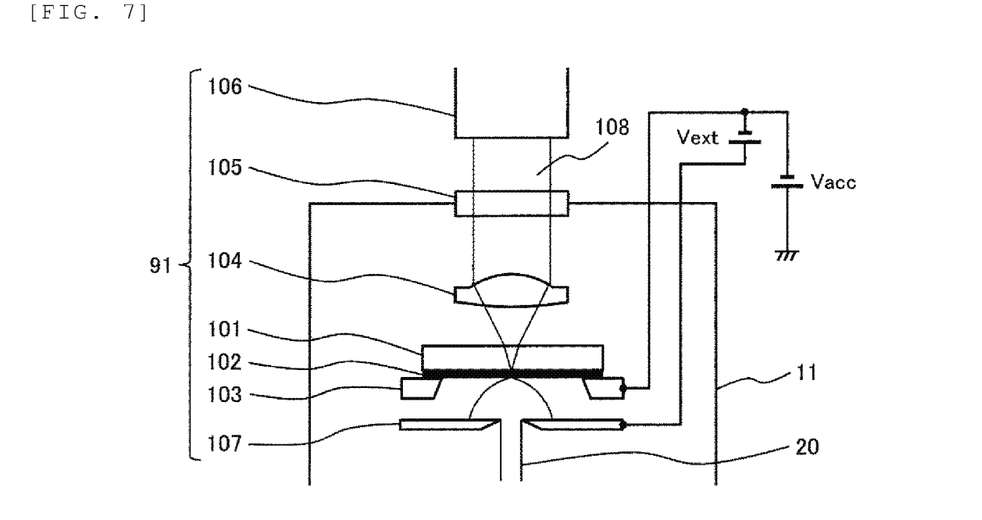
FIG. 7 is a diagram for describing an optically-excited electron gun provided in the SEM shown in FIG. 6.

FIG. 7 shows the optically-excited electron gun 91 in detail. The optically-excited electron gun 91 includes a transparent substrate 101, a GaAs film 102, a holder 103, a condenser lens 104, a window 105, an optical fiber 106, and an extraction electrode 107. The GaAs film 102 is attached to the transparent substrate 101 and the GaAs film contacts the holder 103 made of a metal.

An acceleration voltage (Vacc in FIG. 7) generated by the high voltage generator 93 is applied to the holder 103, and an extraction voltage (Vext in FIG. 7) also generated by the high voltage generator 93 is applied to the extraction electrode 107 disposed below the holder 103.

A laser beam 108, which is generated by the excitation light controller 94 and emitted from an end face of the optical fiber 106, passes through the window 105 of a housing 11 and is focused on the GaAs film 102 by the condenser lens 104. The periphery of the GaAs film 102 in the housing 11 is under an ultra-high vacuum of $10^{-8}$ Pa or less due to an exhaust unit (not shown), and, in the vicinity of the focal point of the laser beam 108, on the GaAs film 102, electrons in the valence electron band of the GaAs film 102 are excited to the conduction band, and the electrons are emitted from a surface into the ultra-high vacuum by negative electron affinity (NEA). The emitted electrons are guided to an electron optical system by the extraction electrode 107 to which the extraction voltage Vext is applied and become the electron beam 20.

In the SEM of the present embodiment, a blanking control signal is input from the blanking controller 45 to the excitation light controller 94 in the optically-excited electron gun controller 92. The excitation light controller 94 turns a laser beam ON/OFF based on the blanking control signal, and the electron beam 20 emitted from the optically-excited electron gun 91 is also turned ON/OFF as the laser beam is turned ON/OFF. In other words, ON/OFF of the irradiation of the electron beam 20 onto the sample 21 is controlled by the blanking control signal output from the blanking controller 45.

Figure 8:
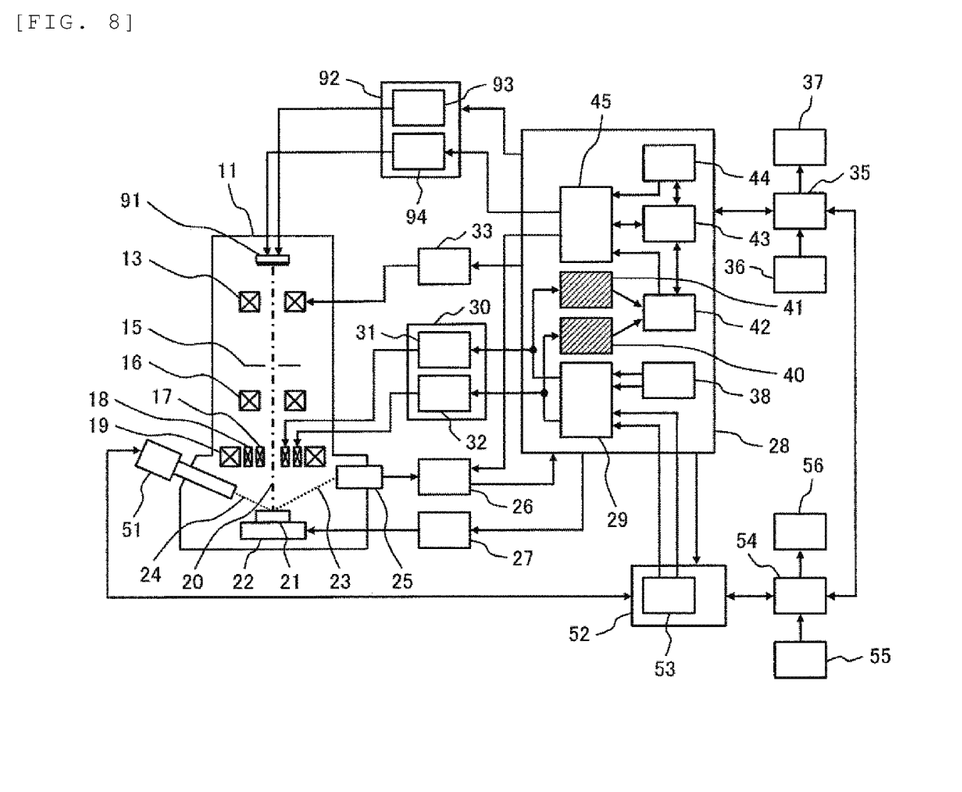
FIG. 8 is a schematic perspective view (partial cross-sectional view) of an example of an SEM having mounted thereon an EDX apparatus according to the second embodiment.

FIG. 8 is a schematic perspective view (partial cross-sectional view) of an SEM on which an EDX apparatus is mounted, according to the present embodiment. As apparent from the descriptions given above with reference to FIG. 6, with respect to a scanning control voltage input to the SEM from the EDX apparatus, a pixel shift timing is detected and pixel coordinates serving as a current target of deflection are calculated, and thus pre-set electron beam irradiation conditions for respective pixels are applied to the EDX analysis. Therefore, electrification of a sample even for a non-conductive sample being analyzed under a high vacuum environment can be suppressed. Here, the reference numeral 55 denotes an operation interface.

In addition, in the present embodiment, it is unnecessary to turn OFF an irradiation onto a sample by deflecting an electron beam by using a blanker as in the first embodiment, and thus the blanker can be omitted in an electron optical system. Therefore, there are advantages including elimination of deflection noise of the blanker with respect to an electron beam and improved design freedom.

As described above, according to the present embodiment, a charged particle beam apparatus capable of stably detecting charged particles and electromagnetic waves and enabling observation or analysis of a sample even for a non-conductive sample under a high vacuum environment can be provided. In addition, by using an optically-excited electron gun as an electron gun, a blanker can be omitted from an electron optical system, thereby eliminating deflection noise of the blanker with respect to an electron beam and improving design freedom.

The present invention includes the following embodiments.

(1) A charged particle beam apparatus including:
an optically-excited charged particle gun;
a scanning defector for scanning a charged particle beam emitted from the optically-excited charged particle gun onto a sample;
a detector for detecting a scanning control voltage input from an outside into the scanning deflector;
an arithmetic unit for calculating, based on the detected scanning control voltage, irradiation pixel coordinates for the charged particle beam; and
an irradiation controller for controlling irradiation of the sample with the charged particle beam according to the irradiation pixel coordinates.

(2) A charged particle beam apparatus including:
a charged particle gun;
a scanning defector for scanning a charged particle beam emitted from the charged particle gun onto a sample;
a scanning control voltage generator for generating a scanning control voltage to be input to the scanning deflector;
a detector for detecting an external scanning control voltage, which is input from an outside to the scanning deflector and is different from the scanning control voltage;
an arithmetic unit for calculating, based on the detected external scanning control voltage, irradiation pixel coordinates for the charged particle beam; and
an irradiation controller for controlling irradiation of the sample with the charged particle beam according to the irradiation pixel coordinates.

(3) In the charged particle beam apparatus (2),
the charged particle beam apparatus includes a blanker, and
the irradiation controller controls ON/OFF of irradiation from the charged particle gun onto the sample with the charged particle beam through the blanker.

(4) In the charged particle beam apparatus of (2),
the charged particle gun is an optically-excited charged particle gun, and
the irradiation controller controls an excitation light controller of the optically-excited charged particle gun, thereby controlling ON/OFF of irradiation from the optically-excited charged particle gun onto the sample with the charged particle beam.

Furthermore, the present invention is not limited to the embodiments described above, and various modifications can be made therein. For example, the above-described embodiments have been described in detail to facilitate the understanding of the present invention and are not necessarily limited to those having all the configurations described above. Furthermore, a part of the configuration of one embodiment can be replaced by the configuration of another embodiment. Also, the configuration of another embodiment can be added to the configuration of one embodiment. Furthermore, the configurations of other embodiments can be added to, deleted from, and replace a part of the configuration of each embodiment.

REFERENCE SIGNS LIST

11: housing
12: electron gun
13: first condenser lens
14: blanker
15: aperture
16: second condenser lens
17: X scanning deflector
18: Y scanning deflector
19: objective lens
20: electron beam
21: sample
22: sample stage
23: secondary electron
24: characteristic X-ray
25: secondary electron detector
26: detection signal processor
27: sample stage controller
28: SEM main controller
29: scanning control voltage switching unit
30: scan driver
31: X scan driver
32: Y scan driver
33: electronic optical system controller
34: electron gun controller
35: computer 36: operation interface
37: monitor
38: SEM scanning control voltage generator
39: blanking driver
40: Y scanning detection AD converter
41: X scanning detection AD converter
42: arithmetic unit
43: storage unit
44: pixel shifting timing signal generator
45: blanking controller
51: EDX detector
52: EDX main controller
53: EDX scanning control voltage generator
54: computer
55: operation interface
56: monitor
71: electron beam irradiation condition setting screen
72: dwell time
73: blanking period
74: Duty ratio
75: number of pixels to be skipped
76: number of frame integrations
77: SEM scanning conjunction checkbox
78: EDX scanning conjunction checkbox
91: optically-excited electron gun
92: optically-excited electron gun controller
93: high-voltage generator
94: excitation light controller
101: transparent substrate
102: GaAs film
103: holder
104: condenser lens
105: window
106: optical fiber
107: extraction electrode
108: laser beam
151: SEM main controller

The invention claimed is:

1. A charged particle beam apparatus comprising:
a charged particle gun;
a scanning deflector configured to scan a charged particle beam emitted from the charged particle gun onto a sample;
a scanning control voltage generator for generating a scanning control voltage to be input to the scanning deflector;
a detector configured to detect an external scanning control voltage, which is input from an outside into the scanning deflector and is different from the scanning control voltage;
an arithmetic unit configured to calculate, based on the detected external scanning control voltage, irradiation pixel coordinates for the charged particle beam;
an irradiation controller configured to control irradiation of the sample with the charged particle beam according to the irradiation pixel coordinates.

2. The charged particle beam apparatus of claim 1, further comprising:
a secondary particle detector configured to detect secondary particles released from the sample by irradiation with the charged particle beam;
a signal processor configured to perform imaging for secondary particle data output from the secondary particle detector according to the irradiation pixel coordinates; and
an image display unit configured to display a secondary particle image imaged by the signal processor.

3. The charged particle beam apparatus of claim 2, wherein
the irradiation controller controls an irradiation time, an interval time between irradiations, and the number of pixels between irradiations.

4. The charged particle beam apparatus of claim 1, wherein
the irradiation controller controls an irradiation time, an interval time between irradiations, and the number of pixels between irradiations.

5. The charged particle beam apparatus of claim 1, wherein
the charged particle beam apparatus is mounted with an energy dispersive X-ray analyzer, a backscattering electron diffractometer, or a superconducting transition-edge sensor type X-ray microcalorimeter which includes the scanning control voltage generator.

6. The charged particle beam apparatus of claim 1, wherein
the charged particle beam apparatus includes a blanker, and
the irradiation controller controls ON/OFF of irradiation from the charged particle gun onto the sample with the charged particle beam through the blanker.

7. The charged particle beam apparatus of claim 1, wherein
the charged particle gun is an optically-excited charged particle gun, and
the irradiation controller controls an excitation light controller of the optically-excited charged particle gun, thereby controlling ON/OFF of irradiation from the optically-excited charged particle gun onto the sample with the charged particle beam.

* * * * *